(12) United States Patent
Wei et al.

(10) Patent No.: US 11,201,345 B2
(45) Date of Patent: Dec. 14, 2021

(54) FE—CR REDOX FLOW BATTERY SYSTEMS AND METHODS OF MANUFACTURE AND OPERATION

(71) Applicant: Creek Channel Inc., Kirkland, WA (US)

(72) Inventors: Kui Wei, Bellevue, WA (US); Liyu Li, Bellevue, WA (US)

(73) Assignee: Creek Channel Inc., Kirkland, WA (US)

( * ) Notice: Subject to any disclaimer, the term of this patent is extended or adjusted under 35 U.S.C. 154(b) by 0 days.

(21) Appl. No.: 16/824,027

(22) Filed: Mar. 19, 2020

(65) Prior Publication Data

US 2020/0373600 A1 Nov. 26, 2020

Related U.S. Application Data

(60) Provisional application No. 62/849,959, filed on May 20, 2019.

(51) Int. Cl.
| | |
|---|---|
| *H01M 8/18* | (2006.01) |
| *H01M 8/0444* | (2016.01) |
| *H01M 4/36* | (2006.01) |
| *H01M 4/38* | (2006.01) |
| *H01M 8/04082* | (2016.01) |
| *H01M 8/04276* | (2016.01) |

(Continued)

(52) U.S. Cl.
CPC ............ *H01M 8/188* (2013.01); *C01G 31/00* (2013.01); *C22B 3/44* (2013.01); *G01R 31/392* (2019.01); *H01M 4/368* (2013.01); *H01M 4/38* (2013.01); *H01M 4/661* (2013.01); *H01M 8/04201* (2013.01); *H01M 8/04276* (2013.01); *H01M 8/04298* (2013.01); *H01M 8/04447* (2013.01); *H01M 8/04455* (2013.01); *H01M 8/04477* (2013.01); *H01M 8/04544* (2013.01); *H01M 10/36* (2013.01); *H01M 10/42* (2013.01); *H01M 50/411* (2021.01); *H01M 2300/0005* (2013.01)

(58) Field of Classification Search
CPC .................... H01M 8/188; H01M 4/36938
See application file for complete search history.

(56) References Cited

U.S. PATENT DOCUMENTS

| | | |
|---|---|---|
| 3,996,064 A | 12/1976 | Thaller |
| 4,159,366 A | 6/1979 | Thaller |

(Continued)

FOREIGN PATENT DOCUMENTS

CN  105702997 A  6/2016

OTHER PUBLICATIONS

Johnson and Reid, "Chemical and Electrochemical Behavior of the Cr(III)/Cr(II) Half-Cell in the Iron-Chromium Redox Energy Storage System," J. Electrochem. Soc.: Electrochemical Science and Technology; vol. 132, No. 5; May 1985; pp. 1058-1062.

(Continued)

*Primary Examiner* — Matthew J Merkling
(74) *Attorney, Agent, or Firm* — Branch Partners PLLC; Bruce E. Black (57) ABSTRACT

A redox flow battery system includes an anolyte having chromium ions in solution; a catholyte having iron ions in solution, where a molar ratio of chromium in the anolyte to iron in the catholyte is at least 1.25; a first electrode in contact with the anolyte; a second electrode in contact with the catholyte; and a separator separating the anolyte from the catholyte.

20 Claims, 11 Drawing Sheets

(51) Int. Cl.
  *H01M 8/04537* (2016.01)
  *G01R 31/392* (2019.01)
  *C01G 31/00* (2006.01)
  *C22B 3/44* (2006.01)
  *H01M 4/66* (2006.01)
  *H01M 8/04298* (2016.01)
  *H01M 10/36* (2010.01)
  *H01M 10/42* (2006.01)
  *H01M 50/411* (2021.01)

(56) References Cited

U.S. PATENT DOCUMENTS

| | | | |
|---|---|---|---|
| 4,192,910 A | 3/1980 | Giner et al. | |
| 4,270,984 A | 6/1981 | Giner et al. | |
| 4,454,649 A | 6/1984 | Jalan et al. | |
| 4,485,154 A | 11/1984 | Remick et al. | |
| 4,543,302 A | 9/1985 | Gahn et al. | |
| 4,576,878 A | 3/1986 | Gahn | |
| 4,732,827 A | 3/1988 | Kaneko et al. | |
| 4,786,567 A | 11/1988 | Skyllas-Kazacos et al. | |
| 4,814,241 A | 3/1989 | Nagashima et al. | |
| 4,874,483 A | 10/1989 | Wakabayashi et al. | |
| 4,882,241 A | 11/1989 | Heinzel | |
| 4,956,244 A | 9/1990 | Shimizu et al. | |
| 7,320,844 B2 | 1/2008 | Skyllas-Kazacos | |
| 7,820,312 B2 | 10/2010 | Eickhoff | |
| 7,855,005 B2 | 12/2010 | Sahu | |
| 7,919,204 B2 | 4/2011 | Sahu | |
| 7,927,731 B2 | 4/2011 | Sahu | |
| 7,976,974 B2 | 7/2011 | Kazacos et al. | |
| 8,230,736 B2 | 7/2012 | Sahu et al. | |
| 8,236,463 B2 | 8/2012 | Sahu et al. | |
| 8,264,202 B2 | 9/2012 | Sahu et al. | |
| 8,338,008 B2 | 12/2012 | Zu et al. | |
| 8,349,477 B2 | 1/2013 | Parakulam et al. | |
| 8,394,529 B2 | 3/2013 | Keshavarz et al. | |
| 8,535,821 B2 | 9/2013 | Parakulam et al. | |
| 8,541,121 B2 | 9/2013 | Keshavarz et al. | |
| 8,551,299 B2 | 10/2013 | Keshavarz et al. | |
| 8,587,150 B2 | 11/2013 | Parakulam | |
| 8,587,255 B2 | 11/2013 | Parakulam et al. | |
| 8,609,270 B2 | 12/2013 | Xia et al. | |
| 8,628,880 B2 | 1/2014 | Li et al. | |
| 8,771,856 B2 | 7/2014 | Li et al. | |
| 8,785,023 B2 | 7/2014 | Horne et al. | |
| 8,852,777 B2 | 10/2014 | Keshavarz et al. | |
| 8,877,365 B2 | 11/2014 | Keshavarz et al. | |
| 8,906,529 B2 | 12/2014 | Horne et al. | |
| 8,916,281 B2 | 12/2014 | Chang et al. | |
| 8,951,665 B2 | 2/2015 | Keshavarz et al. | |
| 8,980,454 B2 | 3/2015 | Pham et al. | |
| 8,980,484 B2 | 3/2015 | Chang et al. | |
| 8,993,183 B2 | 3/2015 | Pham et al. | |
| 9,077,011 B2 | 7/2015 | Li et al. | |
| 9,123,931 B2 | 9/2015 | Li et al. | |
| 9,130,218 B2 | 9/2015 | Wang et al. | |
| 9,153,832 B2 | 10/2015 | Li et al. | |
| 9,257,710 B2 | 2/2016 | Keshavarz et al. | |
| 9,368,824 B2 | 6/2016 | Xia et al. | |
| 9,722,264 B2 | 8/2017 | Li et al. | |
| 9,819,039 B2 | 11/2017 | Li et al. | |
| 9,846,116 B2 | 12/2017 | Li et al. | |
| 9,941,527 B2 | 4/2018 | Li et al. | |
| 9,960,443 B2 | 5/2018 | Wang et al. | |
| 10,044,058 B2 | 8/2018 | Darling et al. | |
| 10,135,087 B2 | 11/2018 | Sun et al. | |
| 10,333,159 B2 | 6/2019 | Li et al. | |
| 10,424,797 B2 | 9/2019 | Zhang et al. | |
| 2002/0108910 A1 | 8/2002 | Lyon | |
| 2008/0292964 A1 | 11/2008 | Kazacos et al. | |
| 2010/0003586 A1* | 1/2010 | Sahu | H01M 8/1016 429/101 |
| 2011/0076526 A1* | 3/2011 | Zu | H01M 8/188 429/51 |
| 2013/0095362 A1 | 4/2013 | Keshavarz et al. | |
| 2014/0127542 A1* | 5/2014 | Li | H01M 8/0289 429/74 |
| 2014/0272483 A1 | 9/2014 | Pham et al. | |
| 2016/0006051 A1* | 1/2016 | Winter | H01M 8/04201 429/418 |
| 2016/0308234 A1 | 10/2016 | Reece et al. | |
| 2016/0315339 A1 | 10/2016 | Darling et al. | |
| 2017/0229728 A1 | 8/2017 | Dong et al. | |
| 2018/0102561 A1 | 4/2018 | Sullivan | |
| 2018/0277868 A1* | 9/2018 | Loretz | H01M 8/188 |
| 2018/0316033 A1 | 11/2018 | Evans | |
| 2020/0006796 A1* | 1/2020 | Su | H01M 10/281 |

OTHER PUBLICATIONS

Norman H. Hagedorn, "NASA Redox Storage System Development Project," Final Report Prepared for U.S. Department of Energy Conservation and Renewable Energy Division of Energy Storage Systems, Oct. 1984, 46 pages.

International Search Report and Written Opinion for PCT Application No. PCT/US2020/033376 dated Sep. 25, 2020.

Invitation to Pay Additional Fees and, where applicable, Protest Fee for PCT Application No. PCT/US2020/033376 dated Jul. 16, 2020.

Official Communication for U.S. Appl. No. 16/824,119 dated May 19, 2020.

Official Communication for U.S. Appl. No. 16/824,195 dated May 19, 2020.

Official Communication for U.S. Appl. No. 16/824,159 dated Jun. 10, 2021.

* cited by examiner

FE—CR REDOX FLOW BATTERY SYSTEMS AND METHODS OF MANUFACTURE AND OPERATION

RELATED PATENT APPLICATIONS

The present patent application claims the benefit of U.S. Provisional Patent Application Ser. No. 62/849,959, filed May 20, 2019, incorporated herein by reference in its entirety.

FIELD

The present invention is directed to the area of redox flow battery systems and methods of making and using redox flow battery systems. The present invention is also directed to iron-chromium (Fe—Cr) redox flow battery systems and methods of making and using Fe—Cr redox flow battery systems.

BACKGROUND

The cost of renewable power generation has reduced rapidly in the past decade and continues to decrease as more renewable power generation elements, such as solar panels, are deployed. However, renewable power sources, such as solar, hydroelectric, and wind sources, are often intermittent and the pattern of user load does not typically coincide with the intermittent nature of the sources. There is a need for an affordable and reliable energy storage system to store power generated by renewable power sources when available and to provide power to users when there is insufficient power generation from the renewable power sources.

BRIEF SUMMARY

One embodiment is a redox flow battery system that includes an anolyte having chromium ions in solution; a catholyte having iron ions in solution, where a molar ratio of chromium in the anolyte to iron in the catholyte is at least 1.25; a first electrode in contact with the anolyte; a second electrode in contact with the catholyte; and a separator separating the anolyte from the catholyte.

In at least some embodiments, the anolyte further includes iron ions in the solution and the catholyte further includes chromium ions in the solution. In at least some embodiments, a molarity of the iron ions in the anolyte is within 25% of a molarity of iron ions in the catholyte and a molarity of the chromium ions in the anolyte is within 25% of a molarity of chromium ions in the catholyte. In at least some embodiments, an initial molarity of in the anolyte is at least 10% less than an initial molarity of $H^+$ in the catholyte.

In at least some embodiments, a molarity of the chromium ions in the anolyte is at least 1.25 times a molarity of the iron ions in the catholyte. In at least some embodiments, a molarity of the chromium ions in the anolyte is at least 1.43 times a molarity of the iron ions in the catholyte. In at least some embodiments, a molarity of the chromium ions in the anolyte is at least 1.67 times a molarity of the iron ions in the catholyte.

In at least some embodiments, a volume of the anolyte is at least 1.25 times a volume of the catholyte. In at least some embodiments, a molarity of the chromium ions in the anolyte is equal to a molarity of the iron ions in the catholyte. In at least some embodiments, a volume of the anolyte is at least 1.43 times a volume of the catholyte. In at least some embodiments, a volume of the anolyte is at least 1.67 times a volume of the catholyte.

In at least some embodiments, the molar ratio of chromium ions in the anolyte to iron ions in the catholyte is at least 1.43. In at least some embodiments, the molar ratio of chromium ions in the anolyte to iron ions in the catholyte is at least 1.67.

In at least some embodiments, the anolyte includes chromium chloride to provide the chromium ions. In at least some embodiments, the catholyte includes iron chloride to provide the iron ions. In at least some embodiments, the anolyte and catholyte both further include hydrochloric acid.

In at least some embodiments, utilization of chromium in the anolyte is limited by the amount of iron in the catholyte. In at least some embodiments, the utilization of chromium in the anolyte is limited to no more than 80% by the amount of iron in the catholyte.

In at least some embodiments, the redox flow battery system does not include a homogenous catalyst. In at least some embodiments, the redox flow battery system does not include a metallic catalyst.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention is directed to the area of redox flow battery systems and methods of making and using redox flow battery systems. The present invention is also directed to iron-chromium (Fe—Cr) redox flow battery systems and methods of making and using Fe—Cr redox flow battery systems.

Redox flow battery systems are a promising technology for the storage of energy generated by renewable energy sources, such as solar, wind, and hydroelectric sources, as well as non-renewable and other energy sources. As described herein, in at least some embodiments, a redox flow battery system can have one or more of the following properties: long life; reusable energy storage; or tunable power and storage capacity.

Figure 1:
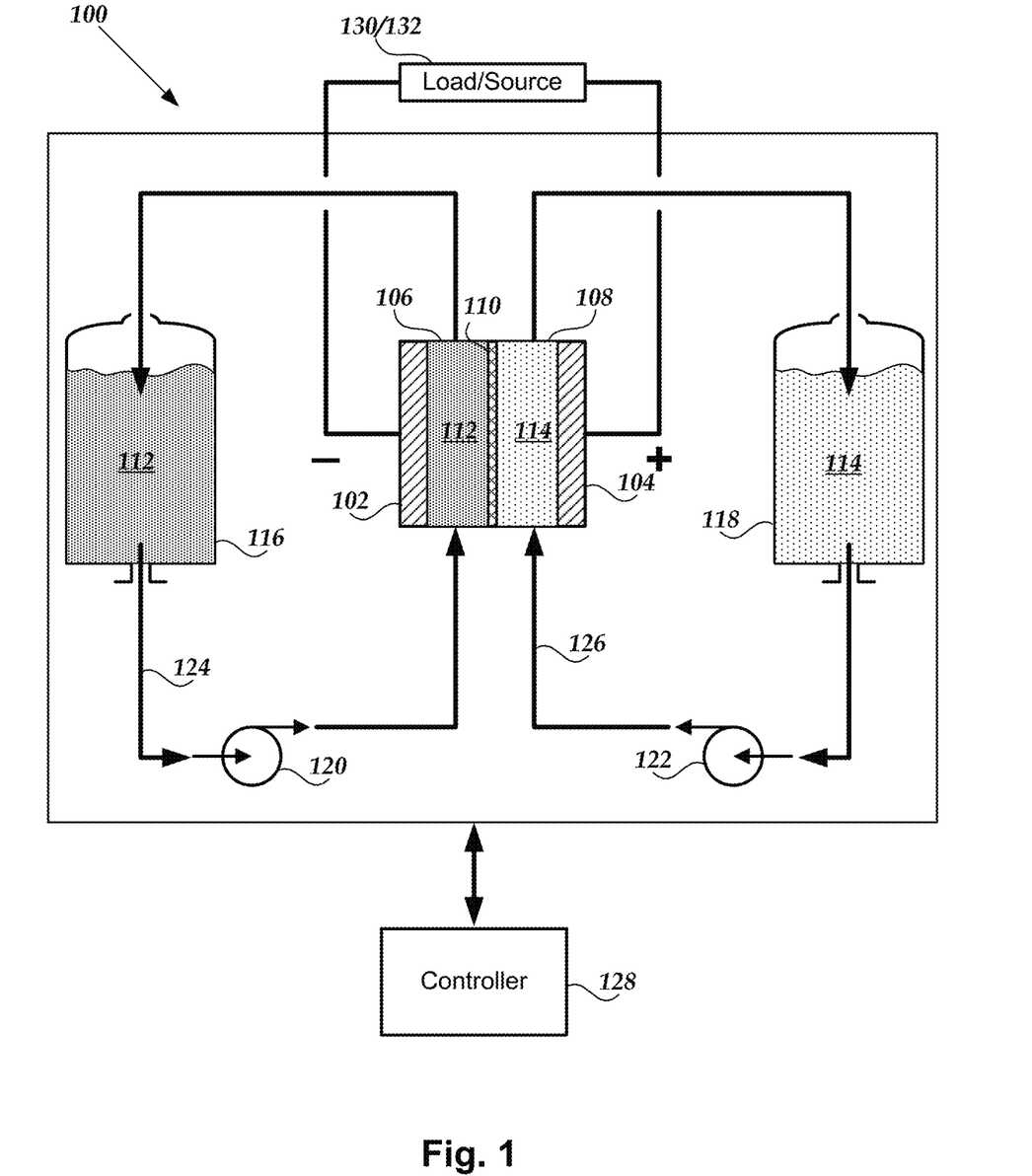
FIG. 1 is a schematic diagram of one embodiment of a redox flow battery system, according to the invention.

FIG. 1 illustrates one embodiment of a redox flow battery system 100. It will be recognized that other redox flow battery systems 100 may include more or fewer elements and the elements may be arranged differently than shown in the illustrated embodiments. It will also be recognized that the description below of components, methods, systems, and the like can be adapted to other redox flow battery systems different from the illustrated embodiments.

The redox flow battery system 100 of FIG. 1 includes two electrodes 102, 104 and associated half-cells 106, 108 that are separated by a separator 110. The electrodes 102, 104 can be in contact or separated from the separator. Electrolyte solutions flow through the half-cells 106, 108 and are referred to as the anolyte 112 and the catholyte 114. The redox flow battery system 100 further includes an anolyte tank 116, a catholyte tank 118, an anolyte pump 120, a catholyte pump 122, an anolyte distribution arrangement 124, and a catholyte distribution arrangement 126. The anolyte 112 is stored in the anolyte tank 116 and flows around the anolyte distribution arrangement 124 through, at least in part, action of the anolyte pump 120 to the half-cell 106. The catholyte 114 is stored in the catholyte tank 118 and flows around the catholyte distribution arrangement 126 through, at least in part, action of the catholyte pump 122 to the half-cell 108. It will be recognized that, although the illustrated embodiment of FIG. 1 includes a single one of each of the components, other embodiments can include more than one of any one or more of the illustrated components. For example, other embodiments can include multiple electrodes 102, multiple electrodes 104, multiple anolyte tanks 116, multiple catholyte tanks 118, multiple half-cells 112, or multiple half-cells 114, or any combination thereof.

The anolyte and the catholyte are electrolytes and can be the same electrolyte or can be different electrolytes. During energy flow into or out of the redox flow battery system 100, the electrolyte in one of the half-cells 106, 108 is oxidized and loses electrons and the electrolyte in the other one of the half-cells is reduced and gains electrons.

The redox flow battery system 100 can be attached to a load/source 130/132, as illustrated in FIG. 1. In a charge mode, the redox flow battery system 100 can be charged or recharged by attaching the flow battery to a source 132. The source 132 can be any power source including, but not limited to, fossil fuel power sources, nuclear power sources, other batteries or cells, and renewable power sources, such as wind, solar, or hydroelectric power sources. In a discharge mode, the redox flow battery system 100 can provide energy to a load 130. In the charge mode, the redox flow battery system 100 converts electrical energy from the source 132 into chemical potential energy. In the discharge mode, the redox flow battery system 100 converts the chemical potential energy back into electrical energy that is provided to the load 130.

The redox flow battery system 100 can also be coupled to a controller 128 that can control operation of the redox flow battery system. For example, the controller 128 may connect or disconnect the redox flow battery system 100 from the load 130 or source 132. The controller 128 may control operation of the anolyte pump 120 and catholyte pump 122. The controller 128 may control operation of valves associated with the anolyte tank 116, catholyte tank 118, anolyte distribution system 124, catholyte distribution system 126, or half-cells 106, 108. The controller 128 may be used to control general operation of the redox flow battery system 100 include switching between charge mode, discharge mode, and, optionally, a maintenance mode (or any other suitable modes of system operation.) In at least some embodiments, the controller or the redox flow battery system may control the temperature of within the half-cells or elsewhere in the system. In at least some embodiments, the temperature of the half-cells (or the system in general or portions of the system) is controlled to be no more than 65, 60, 55, or 50 degrees Celsius during operation.

Any suitable controller 128 can be used including, but not limited to, one or more computers, laptop computers, servers, any other computing devices, or the like or any combination thereof and may include components such as one or more processors, one or more memories, one or more input devices, one or more display devices, and the like. The controller 128 may be coupled to the redox flow battery system through any wired or wireless connection or any combination thereof. The controller 128 (or at least a portion of the controller) may be located local to the redox flow battery system 100 or located, partially or fully, non-locally with respect to the redox flow battery system.

The electrodes 102, 104 can be made of any suitable material including, but not limited to, graphite or other carbon materials (including solid, felt, paper, or cloth electrodes made of graphite or carbon), gold, titanium, lead, or the like. The two electrodes 102, 104 can be made of the same or different materials. In at least some embodiments, the redox flow battery system 100 does not include any homogenous or metallic catalysts for the redox reaction in the anolyte or catholyte or both. This may limit the type of material that may be used for the electrodes.

The separator 110 separates the two half-cells 106, 108. In at least some embodiments, the separator 110 allows the transport of selected ions (for example, $H^+$, $Cl^-$, or iron or chromium ions or any combination thereof) during the charging or discharging of the redox flow battery system 100. In some embodiments, the separator 110 is a microporous membrane. Any suitable separator 110 can be used and examples of suitable separator include, but are not limited to, ion transfer membranes, anionic transfer membranes, cationic transfer membranes, microporous separators, or the like or any combination thereof.

Redox flow battery systems can be safe, reliable, and provide a reusable energy storage medium. It has been challenging, however, to identify a redox flow battery system that has a desirable storage energy with a long life (e.g., a flow battery system that maintains its storage capacity for many charge/discharge cycles), and is made of materials that have abundant availability (e.g., materials that are abundant on Earth and are commercially mined and available in relatively large quantities). Current lithium and vanadium batteries utilize materials that have limited availability. The storage capacity of many conventional battery systems also degrades when subjected 10, 50, or 100 charge/discharge cycles or more. A further challenge for aqueous redox flow battery systems is to manage or avoid the evolution of hydrogen or oxygen from water.

As described herein, a suitable and useful redox flow battery system is an iron-chromium (Fe—Cr) redox flow battery system utilizing $Fe^{3+}/Fe^{2+}$ and $Cr^{3+}/Cr^{2+}$ redox chemistry. Iron and chromium are generally readily commercially available and, at least in some embodiments, the storage capacity of a Fe—Cr redox flow battery system does not degrade by more than 10% or 20% over at least 100, 200, 250, or 500 charge/discharge cycles or can be configured, using maintenance procedures, to maintain at least 70%, 80%, or 90% storage capacity over at least 100, 200, 250, or 500 charge/discharge cycles.

In at least some embodiments, the electrolytes (i.e., the catholyte or anolyte) of a Fe—Cr redox flow battery system include an iron-containing compound or a chromium-containing compound (or both) dissolved in a solvent. In some embodiments, the anolyte and catholyte contain both the iron-containing compound and the chromium-containing compound. The concentrations of these two compounds in the anolyte and catholyte can be the same or different. In other embodiments, the catholyte includes only the iron-containing compound and the anolyte includes only the chromium-containing compound.

The iron-containing compound can be, for example, iron chloride, iron sulfate, iron bromide, or the like or any combination thereof. The chromium-containing compound can be, for example, chromium chloride, chromium sulfate, chromium bromide, or the like or any combination thereof. The solvent can be water; an aqueous acid, such as, hydrochloric acid, hydrobromic acid, sulfuric acid, or the like. In at least some embodiments, both the catholyte and the anolyte of an Fe—Cr redox flow battery system includes iron chloride and chromium chloride dissolved in hydrochloric acid. In at least some embodiments, the catholyte of an Fe—Cr redox flow battery system includes iron chloride dissolved in hydrochloric acid and the anolyte includes chromium chloride dissolved in hydrochloric acid.

In at least some instances, it has been found that chloride-complexed chromium ions (for example, $Cr(H_2O)_5Cl^{2+/+}$) have faster reaction kinetics and lower $H_2$ production than at least some other chromium ion complexes (for example, $Cr(H_2O)_6^{3+/2+}$). Accordingly, the inclusion of chloride in the anolyte (for example, from the chromium-containing compound, the solvent, or both) can be beneficial.

In at least some embodiments, the molarity of iron in the catholyte or the anolyte or both is in a range of 0.5 to 2. In at least some embodiments, the molarity of chromium in the anolyte or the catholyte or both is in a range of 0.5 to 2. In at least some embodiments, the molarity of the hydrochloric acid or other aqueous acid or base is in a range of 0.5 to 4.

One challenge of previous Fe—Cr redox flow batteries is the generation or evolution of hydrogen ($H_2$) at the negative electrode as a result of the redox reactions. In at least some instances, increasing the utilization of the chromium in the redox flow battery can increase the production of hydrogen. It is often desirable to limit or reduce the production of hydrogen in the redox flow battery.

It has been found that limiting the utilization of chromium results in lower hydrogen generation while retaining adequate energy density in the redox flow battery system. In at least some embodiments, the chromium utilization in the anolyte of the redox flow battery system is limited to no more than 80%, 70%, or 60% or less. In at least some embodiments, the chromium utilization in the anolyte is limited by amount of iron in the catholyte or is limited by 100% utilization of the iron in the catholyte.

Chromium utilization can be managed, at least in part, by managing the relative amounts of chromium and iron in the redox flow battery system. The term "molar ratio" as used herein means the ratio of the molar amount of one component with respect to the molar amount of a second component. In at least some embodiments, the molar ratio of chromium in the anolyte to iron in the catholyte (Cr (anolyte)/Fe(catholyte)) is not 1, but, instead, the Cr(anolyte)/Fe(catholyte) molar ratio is at least 1.25 or more (for example, at least 1.43, 1.67, or more). In at least some embodiments, the molar amount of iron in the catholyte is no more than 80%, 70%, or 60% or less of the molar amount of chromium in the anolyte. In at least some embodiments, the smaller amount of available iron limits the utilization of the available chromium to no more than 80%, 70%, or 60%. In at least some embodiments, the anolyte and the catholyte are both mixed iron/chromium solutions.

In at least some embodiments, the concentration of iron in the catholyte is different from the concentration of chromium in the anolyte to produce the desired molar ratio. In at least some embodiments, the concentration of iron in the catholyte is no more than 80%, 70%, or 60% or less of the concentration of chromium in the anolyte.

In at least some embodiments, the concentration of iron in the catholyte and the concentration of chromium in the anolyte is the same. In such embodiments, the molar ratio of chromium and iron in the anolyte and catholyte, respectively, can be selected by selection of the volumes of the anolyte and catholyte. In at least some embodiments, the volume ratio of anolyte to catholyte is at least 1.25:1 or more (for example, at least 1.43:1 or 1.67:1 or more) leading to a molar ratio that is equal to the volume ratio when the concentrations of chromium in the anolyte and iron in the catholyte are the same. In at least some embodiments, the volume of the catholyte is no more than 80%, 70%, or 60% of the volume of the anolyte.

In some embodiments, the volumes of the anolyte and the catholyte can be based on the volume of the respective half-cells 106, 108. In some embodiments, the volumes of the anolyte and the catholyte can be based on the volume of the respective catholyte and anolyte portions of the redox flow battery system 100. For example, the catholyte portion can include the half-cell 108, the catholyte tank 118, and the catholyte distribution arrangement 126. The anolyte portion can include the half-cell 106, the anolyte tank 116, and the anolyte distribution arrangement 124.

It will be recognized that a combination of both different iron and chromium concentrations and different catholyte and anolyte volumes can be used to achieve the desired molar ratio of chromium in the anolyte and iron in the catholyte. In at least some of these embodiments, the volume of the catholyte is no more than 95%, 90%, 80%, 70%, or 60% of the volume of the anolyte.

In at least some instances, it is found that higher $H^+$ concentration in the anolyte promotes hydrogen generation. To reduce hydrogen generation by the anolyte, the $H^+$ concentration in the initial anolyte can be lower than the $H^+$ concentration in the initial catholyte. In at least some embodiments, the $H^+$ concentration in the initial anolyte is at least 10, 20, 25, or 50 percent lower than the $H^+$ concentration in the initial catholyte.

Table 1 illustrates a 1:1 volume ratio of anolyte to catholyte at different states of charge (SOC) where the state of charge represents the percentage conversion of the initial active ionic species in the anolyte and catholyte to the reduced/oxidized ionic species. It will be recognized that the concentration of $H^+$ changes to maintain charge balance between the anolyte and catholyte. In Table 1, the initial anolyte is 1.25M $Fe^{2+}$, 1.25M $Cr^{3+}$, and 1.25M $H^+$ and the initial catholyte is 1.25M $Fe^{2+}$, 1.25M $Cr^{3+}$, and 2.5M $H^+$. These particular concentrations are selected so that the $H^+$ concentration is equal at the 50% state of charge.

TABLE 1

| State of Charge | Anolyte | | | Catholyte | | |
|---|---|---|---|---|---|---|
| | $Cr^{2+}$ | $Cr^{3+}$ | $H^+$ | $Fe^{2+}$ | $Fe^{3+}$ | $H^+$ |
| 0 | 0 | 1.25 | 1.25 | 1.25 | 0 | 2.5 |
| 25 | 0.3125 | 0.9375 | 1.5625 | 0.9375 | 0.3124 | 2.1875 |
| 50 | 0.625 | 0.625 | 1.875 | 0.625 | 0.625 | 1.875 |
| 75 | 0.9375 | 0.3125 | 2.1875 | 0.3125 | 0.9375 | 1.5625 |
| 100 | 1.25 | 0 | 2.5 | 0 | 1.25 | 1.25 |

Table 2 illustrates a 2:1 volume ratio of anolyte to catholyte at different states of charge (SOC). In Table 2, the initial anolyte is 1.25M $Fe^{2+}$, 1.25M $Cr^{3+}$, and 1.5625M $H^+$ and the initial catholyte is 1.25M $Fe^{2+}$, 1.25M $Cr^{3+}$, and 2.5M $H^+$. These particular concentrations are selected so that the $H^+$ concentration is equal when the anolyte is at 25% SOC and the catholyte is at 50% SOC. The difference in SOC between the anolyte and catholyte arises due to anolyte having twice the volume of the catholyte.

TABLE 2

| State of Charge | Anolyte | | | Catholyte | | |
|---|---|---|---|---|---|---|
| | $Cr^{2+}$ | $Cr^{3+}$ | $H^+$ | $Fe^{2+}$ | $Fe^{3+}$ | $H^+$ |
| 0 | 0 | 1.25 | 1.5625 | 1.25 | 0 | 2.5 |
| 25 | 0.3125 | 0.9375 | 1.875 | 0.9375 | 0.3124 | 2.1875 |
| 50 | 0.625 | 0.625 | 2.1875 | 0.625 | 0.625 | 1.875 |
| 75 | | | | 0.3125 | 0.9375 | 1.5625 |
| 100 | | | | 0 | 1.25 | 1.25 |

Another challenge with Fe—Cr redox flow battery systems, as well as other redox flow battery systems, is the presence of metal impurities, such as nickel, antimony, and copper. In at least some instances, these metal impurities can increase hydrogen generation on the negative electrode surface. Such metallic impurities can be present as a natural impurity or as a part of the refining or manufacturing of the iron and chromium compounds or other portions of the redox flow battery system or through any other mechanism.

Figure 3:
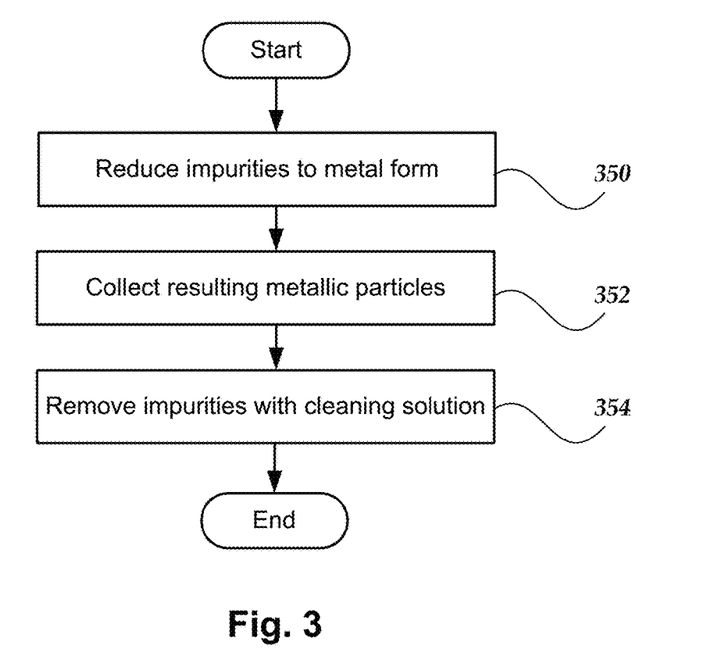
FIG. 3 is a flowchart of a one embodiment of removing or reducing impurities in a redox flow battery system, according to the invention.

In at least some embodiments, the redox flow battery system 100 can be configured to remove, or reduce the level of, these impurities. As illustrated in FIG. 3, in at least some embodiments, to remove, or reduce the level of, these impurities, the redox flow battery system 100 is configured to electrochemically reduce at least some of the impurities to metal form (step 350), collect the resulting metallic particles using a particulate filter or other arrangement such at the interdigitated electrode described below (step 352), and remove these impurities using a cleaning solution containing an oxidizing species (step 354).

Figure 2:
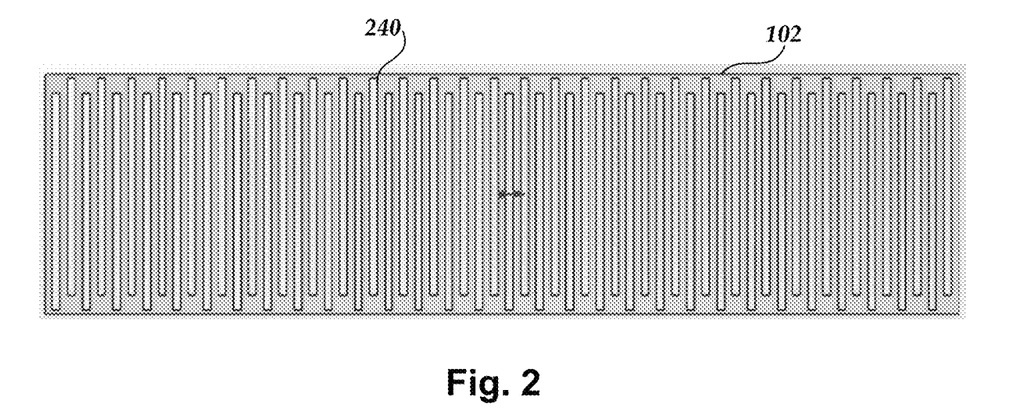
FIG. 2 is a schematic diagram of one embodiment of an electrode for a redox flow battery system, according to the invention.

In at least some embodiments, the impurities are reduced within the anolyte as part of the redox reactions. The impurities form metallic particles or particulates when reduced during charging. The redox flow battery system 100 may include a particulate filter in the half-cell 106 or elsewhere to capture the metallic particles or particulates. In some embodiments, the negative electrode 102 may aid in filtering the metallic particles or particulates. To also facilitate the removal of the impurities, the negative electrode 102 can have an interdigitated structure, as illustrated in FIG. 2. The interdigitated structure includes empty or indented channels 240 for collection of particles of the metallic impurities during operation of the redox flow battery system 100. These particles can then be removed from the electrode during a maintenance cycle, as described below.

In at least some embodiments, the Fe—Cr redox flow battery systems described herein are arranged to remove these impurities using a solution with an oxidizing species, such as $Fe^{3+}$. As part of the maintenance of the redox flow battery system 100, during a maintenance cycle, a $Fe^{3+}$ (or other oxidizing) solution can be flowed through the anolyte portion of the system to remove the impurities from the electrode 102 or elsewhere in the system. In at least some embodiments, the $Fe^{3+}$ solution can be the catholyte or a portion of the catholyte. Alternative oxidizing solutions include, but are not limited to, hydrogen peroxide solutions, ferric chloride solutions, nitric acid, or the like.

In at least some embodiments, the removal or reduction of metallic impurities is performed during manufacturing of the redox flow battery system, prior to the onset of operation of the redox flow battery system, or during operation of the redox flow battery system, or any combination thereof. It will be understood that these methods and systems for removal of metallic impurities are not limited to Fe—Cr redox flow battery systems, but can also be utilized in other redox flow battery systems such as vanadium, vanadium-bromine, vanadium-iron, zinc-bromine, and organic redox flow battery systems.

It has also been found that, in at least some embodiments, occasional exposure of the electrode 102 to the catholyte 114 can facilitate passivation of the surface of the electrode 102 and reduce hydrogen generation. As an example, in one Fe—Cr redox flow battery system the electrode 102 was treated with the catholyte 114 for 1 hour after 17 charge/discharge cycles and the hydrogen generation rate when down from 38.9 ml/min to 10.2 ml/min. In at least some embodiments, operation of the redox flow battery system can periodically (or when initiated or requested by an operator) include a maintenance period in which the half-cell 106 or electrode 102 is exposed to the catholyte (or an electrolyte that has components such as those specified above for the catholyte) for a period of time (for example, 5, 10, 15, 30, 45, 60 minutes or more.) The catholyte may be introduced to the half-cell 106 or electrode 102 once, periodically, intermittently, or continuously during the maintenance period. In at least some of these embodiments, the catholyte 114 can be returned to the catholyte tank 118 after the maintenance period. In at least some embodiments, the maintenance period may be performed when the state of charge of the anolyte is at least 50%, 75% or 90%.

Figure 4:
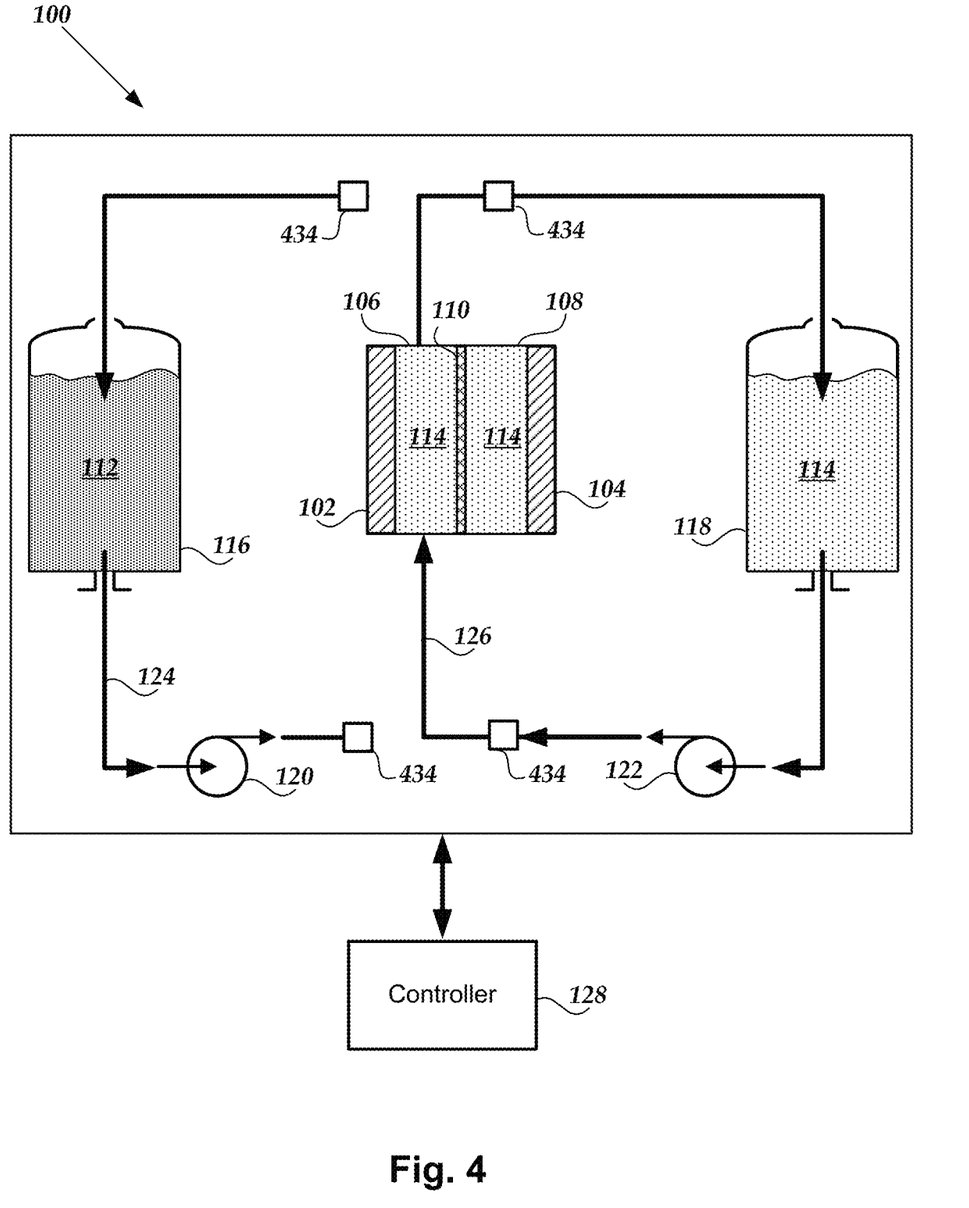
FIG. 4 is a schematic diagram of another embodiment of a redox flow battery system with the catholyte diverted into the second half-cell for maintenance, according to the invention.

FIG. 4 illustrates one embodiment of a redox flow battery system that includes switches 434 for disconnecting the anolyte distribution system 124 from the half cell 106 and connecting the catholyte distribution system 126 to the half-cell 106 to flow catholyte 114 into the half-cell 106. Such an arrangement can be used to reduce or remove metallic impurities or to passivate the electrode 102 or any combination thereof. The pump 122 can be used to flow catholyte 114 into the half-cell 106 or to remove the catholyte 114 from the half-cell 106 when the maintenance is complete.

A Fe—Cr redox flow battery system can have a reduction in storage capacity over time arising, at least in part, from the low standard potential of the $Cr^{2+}/Cr^{3+}$ pair which results in at least some level of hydrogen generation on the anolyte side of the system. As a result the Average Oxidation State (AOS) of the active species in the system increases and the system can become unbalanced and the storage capacity decrease. It is useful, therefore, to have methods or arrangements for at least partially restoring the storage capacity by recovering the AOS.

In at least some embodiments, the AOS for a Fe—Cr redox flow battery system can be described as: AOS= ((Moles of $Fe^{3+}$ in catholyte and anolyte)*3+(Moles of $Fe^{2+}$ in catholyte and anolyte)*2+(Moles of $Cr^{3+}$ in anolyte and catholyte) *3+(Moles of $Cr^{2+}$ in anolyte and catholyte)*2)/ (Moles of Fe in catholyte and anolyte+Moles of Cr in anolyte and catholyte).

To rebalance the redox flow battery system, in at least some embodiments, the redox flow battery system includes a balance arrangement, in conjunction with either the anolyte or catholyte, to rebalance the system and restore storage capacity. In at least some embodiments, the balance arrangement utilizes a vanadium source (to produce oxovanadium ($VO^{2+}$) and dioxovanadium ($VO_2^+$) ionic species) and a reductant, such as an oxidizable hydrocarbon compound, to rebalance the system and restore storage capacity. The following embodiments illustrate the addition of a balance arrangement to a Fe—Cr redox flow battery system. It will be understood that such balance arrangements can be used with other redox flow battery systems, or other chemical and/or electrochemical systems.

Figure 5A:
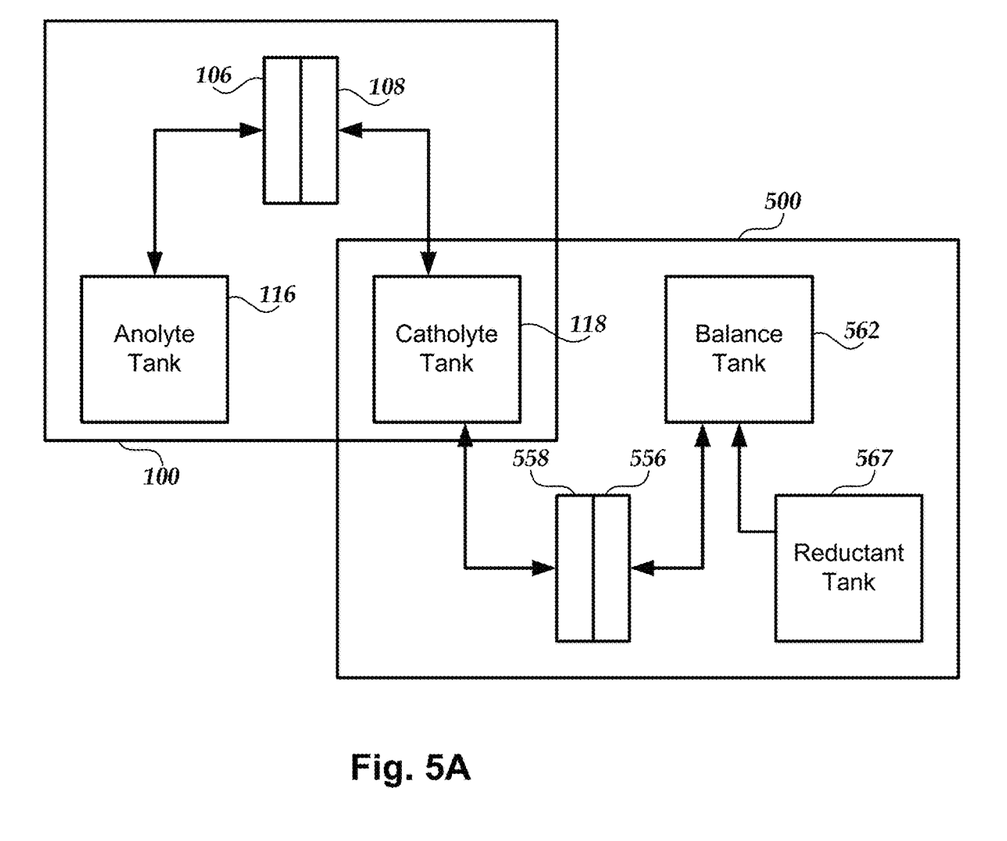
FIG. 5A is a schematic diagram of one embodiment of a system that includes a redox flow battery system in conjunction with a balancing arrangement, according to the invention.
Figure 5B:
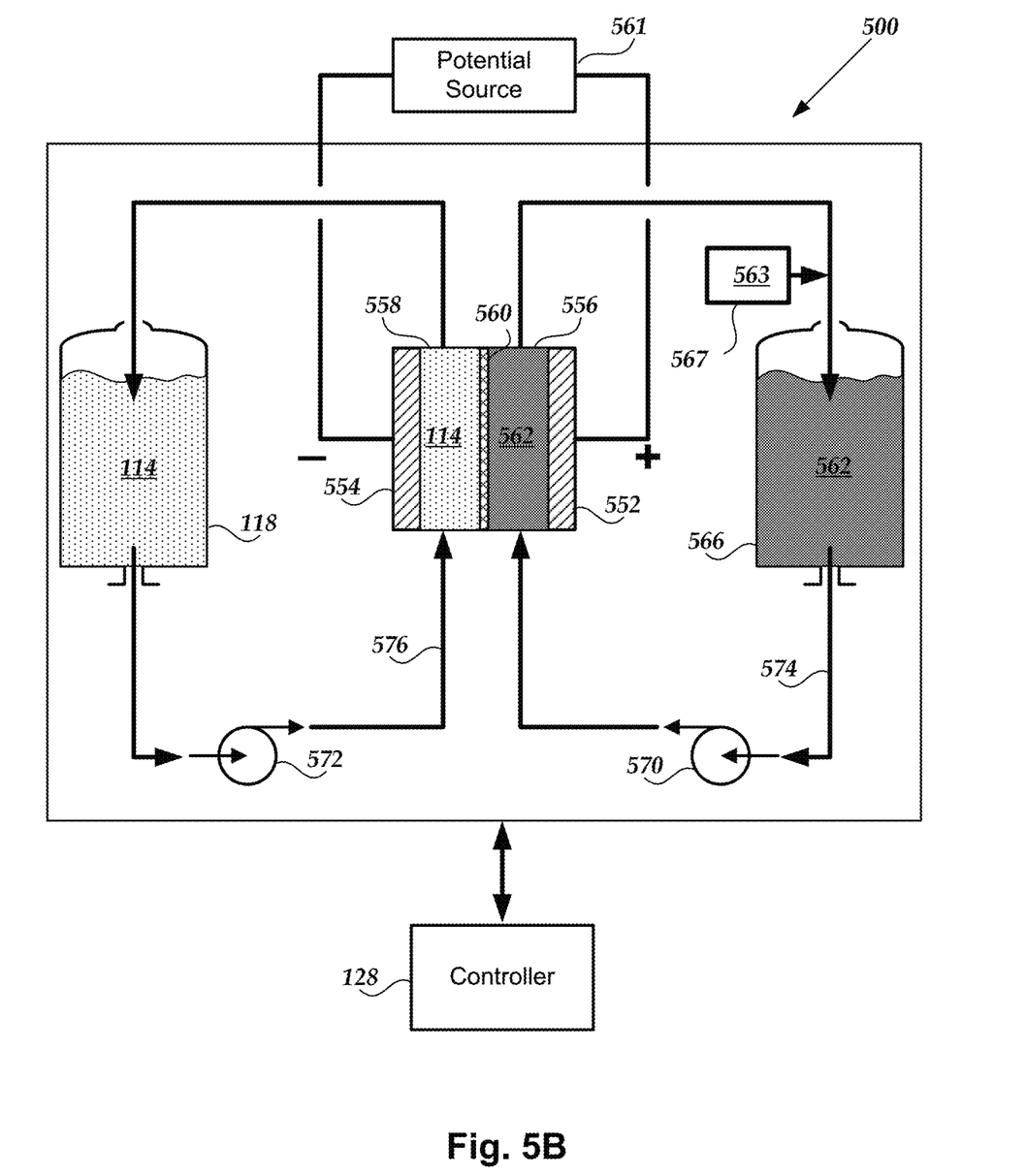
FIG. 5B is a schematic diagram of one embodiment of the balancing arrangement of the system of FIG. 5A, according to the invention.

FIG. 5A illustrates one embodiment of portions of the redox flow battery system 100 and a balance arrangement 500. FIG. 5B illustrates one embodiment of the balance arrangement 500. In this embodiment, the catholyte 114 is used in conjunction with a balancing electrolyte 562 (for example, an electrolyte containing $VO^{2+}/V_2^+$) and a reductant 563 to rebalance the redox flow battery system 100. The balance arrangement 500 includes the catholyte tank 118; balance electrodes 552, 554; balance half-cells 556, 558; balance separator 560; catholyte balance pump 572; catholyte balance distribution system 576; balance tank 566; reductant tank 567; balance electrolyte pump 570; balance electrolyte distribution arrangement 574; and potential source 561.

The following reaction equations illustrate one example of the rebalancing of the system using the iron-based catholyte 114, a balancing electrolyte 562 containing oxovanadium ions, and a reductant 563 containing fructose, along with the application of an external potential from the potential source 561 of at least 0.23 V:

Via these reactions, the AOS of the redox flow battery system 100 can be reduced and the $H^+$ ions lost in hydrogen generation restored. In at least some embodiments, this rebalancing (or restoring of the AOS or storage capacity recovery) does not utilize any metallic catalyst as such catalysts often increase hydrogen generation. In at least some embodiments, $VO^{2+}$ of the balance electrolyte 562 can be considered a homogeneous catalyst as the $VO^{2+}$ ions are regenerated using the reductant 563. In at least some embodiments, the reduction of $VO^{2+}$ ions happens in balance half cell 566.

In at least some embodiments, the oxidation of the reductant 563 can be performed in the balance tank 566 instead of the half-cell 556 and may not require the application of an external potential, as long as $VO_2^+$ ions are available. Suitable reducing agents include sugars (for example, fructose, glucose, sucrose, or the like or any combination thereof), carboxylic acids (for example, formic acid, acetic acid, propionic acid, oxalic acid, or the like or any combination thereof), aldehydes (for example, formaldehyde, acetaldehyde, or the like or any combination thereof), alcohols (for example, methanol, ethanol, propanol, or the like or any combination thereof), other hydrocarbons, or hydrogen gas. In at least some embodiments, the reductant is soluble or at least partially soluble in water.

In at least some embodiments, the reductant 563 is added either periodically, intermittently, or continuously to the balance electrolyte 562 from the reductant tank 567. In at least some embodiments, this rebalancing process (for recovering the storage capacity or restoring the AOC) occurs continuously, intermittently, or periodically. For example, the catholyte balance pump 572 and balance electrolyte pump 570 can operate continuously, intermittently, or periodically. In at least some embodiments, the catholyte pump 122 can also be used as the catholyte balance pump 572. Moreover, the catholyte balance distribution arrangement 576 may include a valve to couple to, or disconnect from, the catholyte tank 118.

Figure 5C:
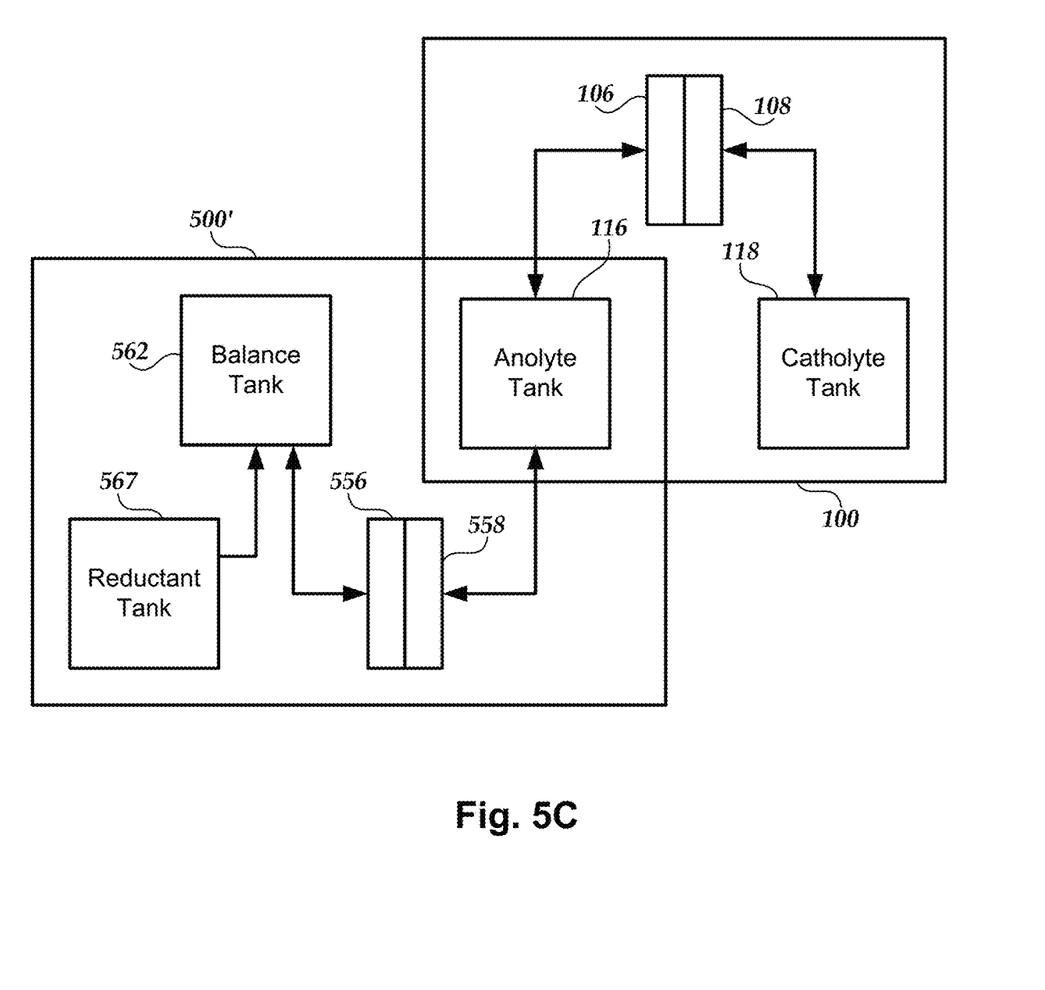
FIG. 5C is a schematic diagram of another embodiment of a system that includes a redox flow battery system in conjunction with a balancing arrangement, according to the invention.
Figure 5D:
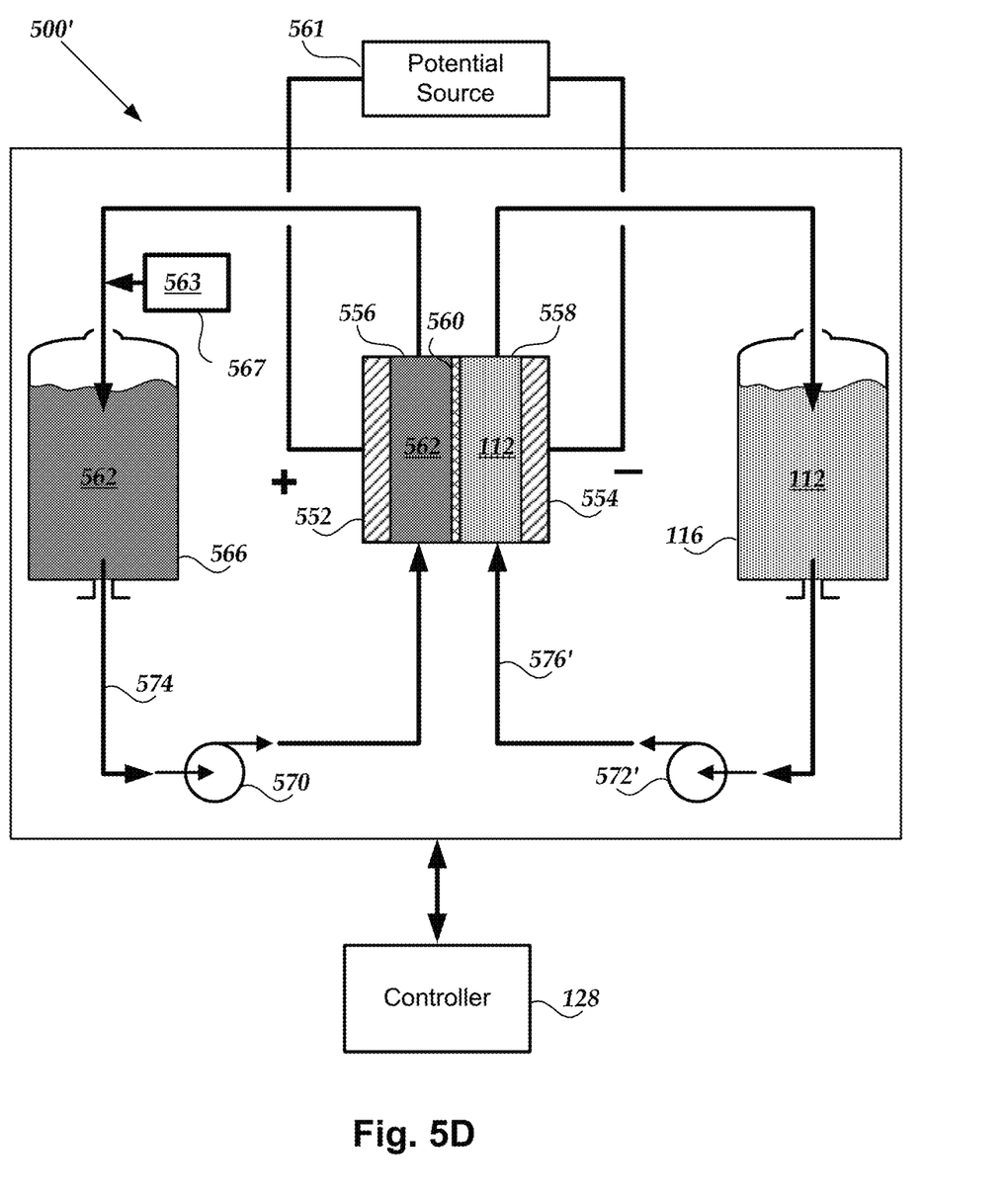
FIG. 5D is a schematic diagram of one embodiment of the balancing arrangement of the system of FIG. 5C, according to the invention.

FIGS. 5C and 5D illustrate another embodiment of redox flow battery system 100 with a balance arrangement 500' which operates with the anolyte 112 (and corresponding anolyte pump 572' and anolyte balance distribution arrangement 576') instead of the catholyte. In at least some embodiments, the anolyte pump 120 can also be used as the anolyte balance pump 572'.

Figure 5E:
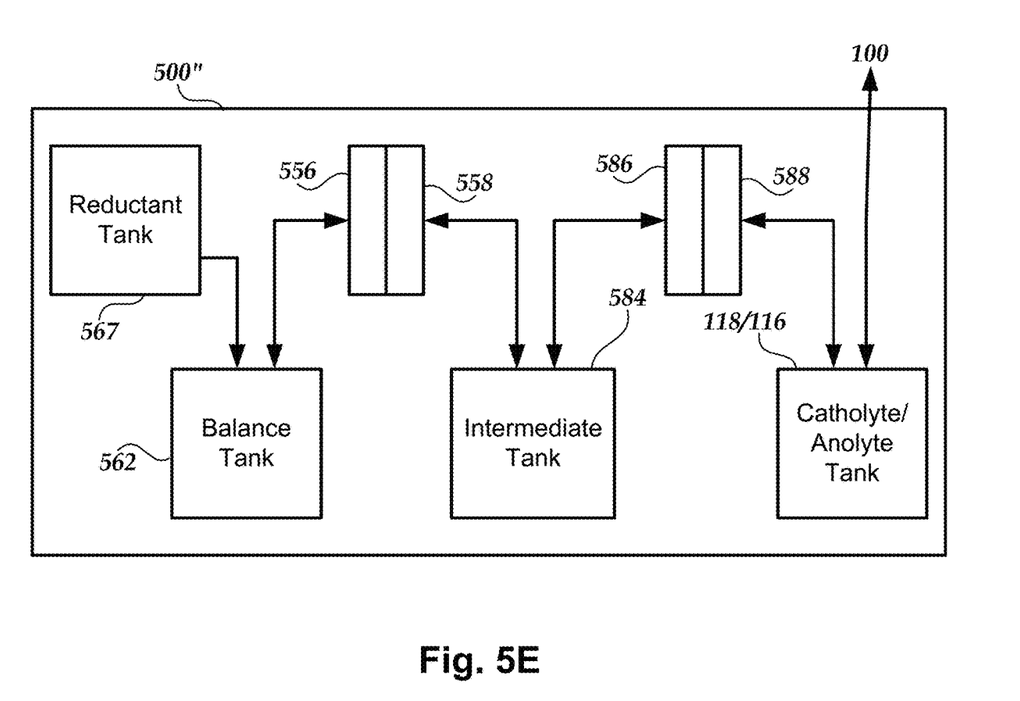
FIG. 5E is a schematic diagram of another embodiment of a balancing arrangement, according to the invention.

The following reaction equations illustrate one example of the rebalancing of the system using the chromium-based anolyte 112, a balancing electrolyte 562 containing oxovanadium ions, and a reductant 563 containing fructose, along with the application of an external potential from the potential source 561 of at least 1.40 V:

FIG. 5E illustrates another embodiment of a balance arrangement 500" which can be adapted to operate with either the catholyte or anolyte and the corresponding catholyte/anolyte tank 118/116 that is coupled to the remainder of the redox flow battery system 100. This embodiment incorporates an intermediate tank 584 and two intermediate half-cells 586, 588 between the catholyte/anolyte tank 118/116 and the balance tank 562 and corresponding half-cells 556/558. (As with the balance tank, there can be an intermediate pump and intermediate distribution arrangement, as well as an intermediate separator between the two half-cells 586, 588 and a source potential to apply a potential between the electrodes of the two half-cells 586, 588.) In one embodiment, the intermediate electrolyte in the intermediate tank 584 contains $V^{2+}/V^{3+}$ ions.

The following reaction equations illustrate one example of the rebalancing of the system using balance arrangement 500" and the catholyte 114 of redox flow battery system 100 (FIG. 1).

$$VO^{2+}+H_2O-e^-\to VO_2^++2H^+\text{(half-cell 556)}$$

$$V^{3+}+e^-\to V^{2+}\text{(half-cell 558)}$$

$$V^{2+}-e^-\to V^{3+}\text{(half-cell 586)}$$

$$Fe^{3+}+e^-\to Fe^{2+}\text{(half-cell 588)}$$

$$24VO_2^++24H^++C_6H_{12}O_6\to 24VO^{2+}+6CO_2+18H_2O \text{ (balance tank 562 or half cell 556 or both)}$$

Another embodiment uses the anolyte ($Cr^{2+}/Cr^{3+}$) instead of the catholyte in conjunction with the intermediate electrolyte and balance electrolyte. Yet another embodiment uses the anolyte and replaces the $V^{2+}/V^{3+}$ intermediate electrolyte with a $Fe^{2+}/Fe^{3+}$ intermediate electrolyte.

It will be recognized that the balance arrangement described herein can be utilized with other redox flow battery systems and, in particular, those that are capable of generating hydrogen gas. Examples of such redox flow battery system include, but are not limited to, Zn—Br or Zn—Cl redox flow battery systems, vanadium-based (for example, all vanadium, V—Br, V—Cl, or V-polyhalide) redox flow battery systems; Fe—V or other iron-based redox flow battery systems (for example, an all iron redox flow battery system); or organic redox flow battery systems.

Figure 6A:
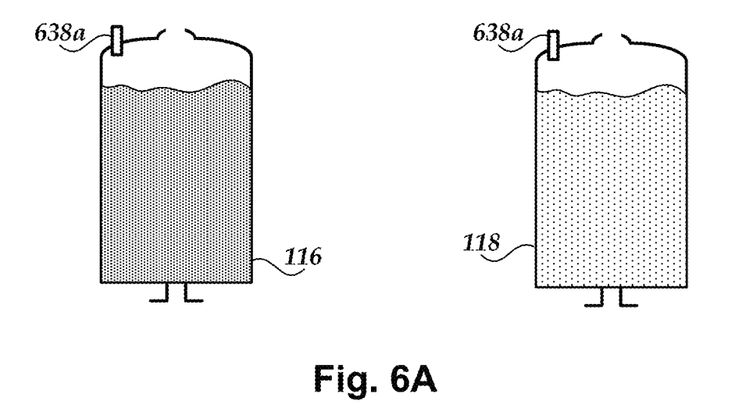
FIG. 6A is a schematic diagram of electrolyte tanks of a redox flow battery system with pressure release valves, according to the invention.
Figure 6B:
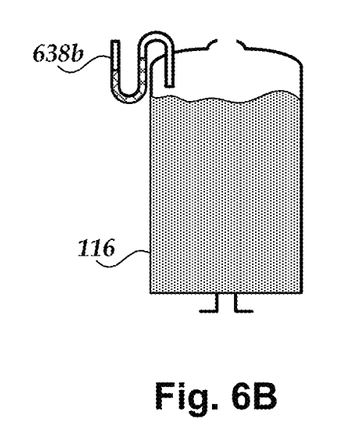
FIG. 6B is a schematic diagram of an electrolyte tank of a redox flow battery system with a liquid-containing U-tube arrangement for pressure relief, according to the invention.
Figure 6C:
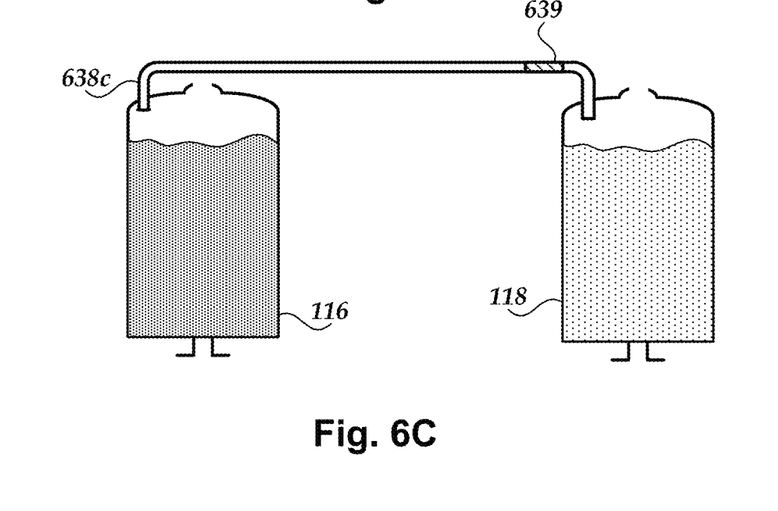
FIG. 6C is a schematic diagram of electrolyte tanks of a redox flow battery system with an arrangement for migration of gas between the tanks, according to the invention.

In some embodiments, during $Fe^{2+}$-overcharging conditions, chlorine gas ($Cl_2$) can be generated on the catholyte side of the redox flow battery system 100. The chlorine may be confined in the catholyte headspace of, for example, the catholyte tank 118 or half-cell 108 or the like or any combination thereof. Continued generation of chlorine gas increases the pressure in the confined catholyte headspace. In at least some embodiments, this may result in the chlorine gas migrating to the anolyte headspace via a connection 638c (FIG. 6C) which optionally includes one or more valves or switches 639 to control flow. In at least some embodiments, at least a portion of the chlorine gas may be absorbed by the anolyte solution. In at least some embodiments, the following reactions can occur between chlorine and the anolyte solution to chemically discharge the overcharged system:

$$2Cr^{2+}+Cl_2\to 2Cr^{3+}+2Cl^-$$

$$2Fe^{2+}+Cl_2\to 2Fe^{3+}+2Cl^-$$

In at least some embodiments, the redox flow battery system 100 may include a pressure release system to manage pressure in the catholyte or anolyte headspace. For example, a pressure relief valve 638a (FIG. 6A) or a liquid-containing U-tube arrangement 638b (FIG. 6B) may be coupled to the catholyte headspace to manage the pressure. Similarly, a pressure relief valve or a liquid-containing U-tube arrangement may be coupled to the anolyte headspace. In at least some embodiments, gas in the anolyte or catholyte headspace may exchange with an environmental atmosphere via a bi-directional gas pressure control system such as the U-tube arrangement. In at least some embodiments, a U-tube arrangement may also be used as a gas leak monitor. In at least some embodiments, the liquid in a U-tube arrangement may contain an acid level indicator that can be used to estimate the amount of acid-containing gas released into the environment by the redox flow battery system.

In at least some instances, the acidic solutions and chemical vapor from leaks of the electrolytes and chemical products of the redox reactions can damage electronic devices (for example, the controller 128, switches, valves, pumps, sensors, or the like) in the redox flow battery system 100. In addition, the leaks may result in environmental damage or contamination.

Figure 7:
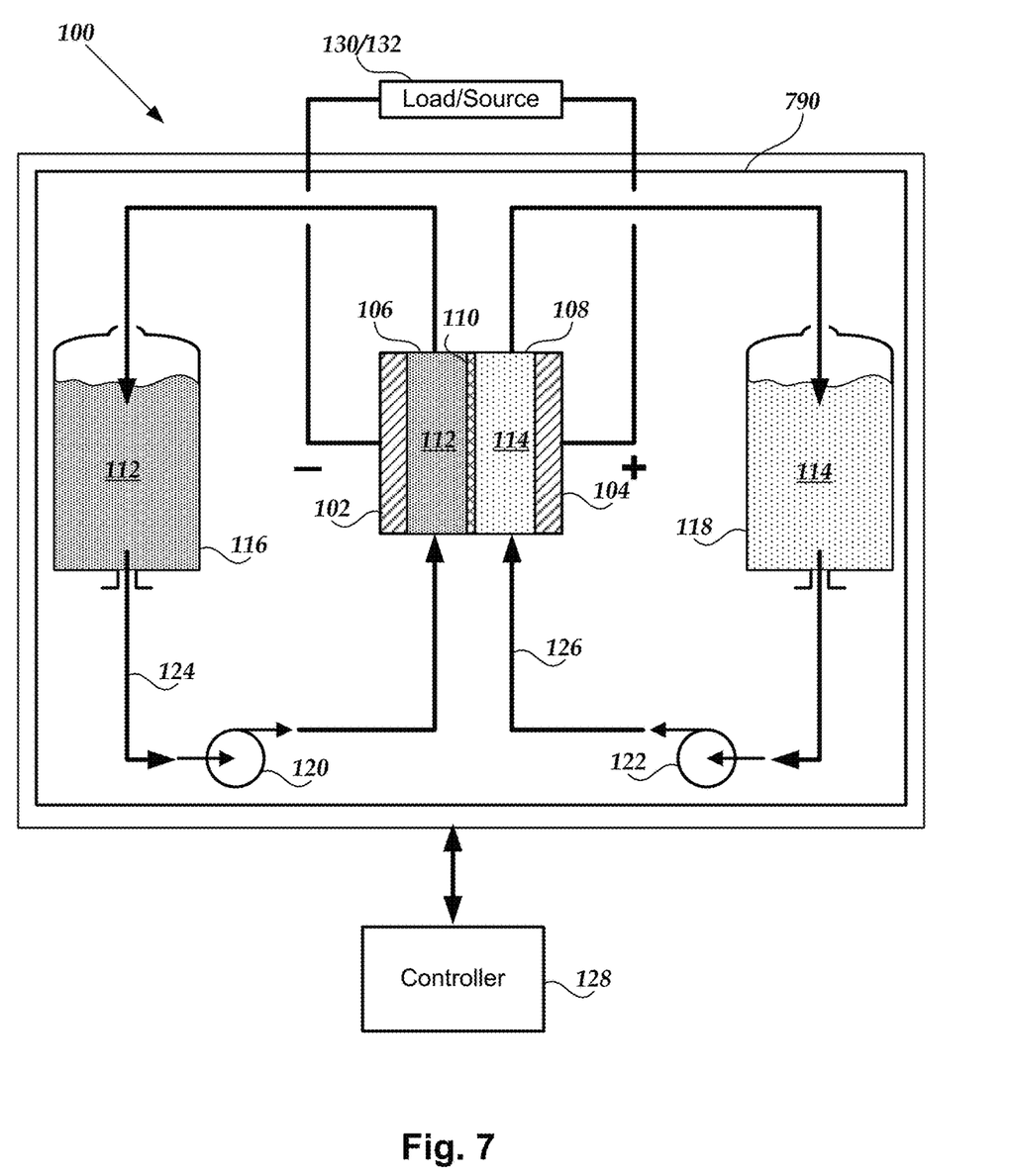
FIG. 7 is a schematic diagram of another embodiment of a redox flow battery system with a secondary container, according to the invention.

In at least some embodiments, all or a portion of the redox flow battery system 100 that contains the anolyte or catholyte or both can be situated in a secondary container 790 (FIG. 7) that contains acid absorbent material, such as sodium carbonate, sodium bicarbonate, calcium carbonate, or calcium oxide or the like. In at least some embodiments, the secondary container can contain sufficient acid absorbent material to neutralize at least 10, 25, 40, 50, 60, 70, 75, 90 percent or more of the anolyte or catholyte or both.

Figure 8:
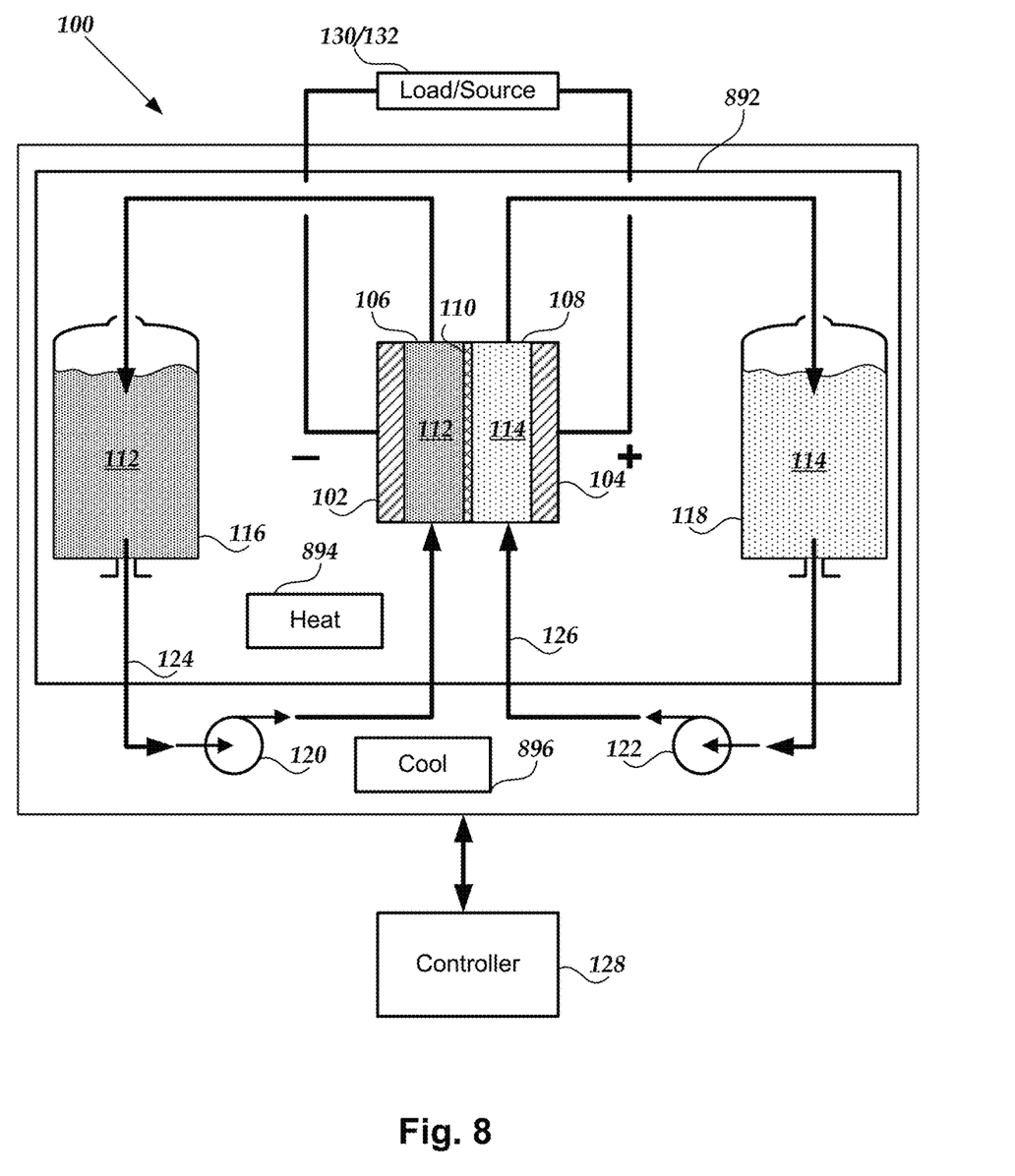
FIG. 8 is a schematic diagram of another embodiment of a redox flow battery system with a temperature zone, according to the invention.

In some embodiments, the anolyte and catholyte containing components, such as the anolyte or catholyte tanks 116, 118, half-cells 106, 108, at least some portions of the anolyte or catholyte distribution systems 124, 126, electrodes 102, 104, or the like, of the redox flow battery system 100 are maintained at a temperature of at least 50, 60, 70, or 80 degrees Celsius or more during charge or discharge periods in a temperature zone 892, as illustrated in FIG. 8. The temperature of these components may be maintained using one or more heating devices 894. In addition, one or more of electronic components of the redox flow battery system, such as one or more of the controller 128, the pumps 120, 122, one or more sensors, one or more valves, or the like, are maintained at a temperature of no more than 40, 35, 30, 25, or 20 degrees Celsius or less. The temperature of these components may be maintained using one or more cooling devices 896.

The above specification provides a description of the manufacture and use of the invention. Since many embodiments of the invention can be made without departing from the spirit and scope of the invention, the invention also resides in the claims hereinafter appended.

What is claimed as new and desired to be protected by Letters Patent of the United States is:

1. A redox flow battery system, comprising
an anolyte comprising chromium ions in solution;
a catholyte comprising iron ions in solution, wherein a molar ratio of chromium in the anolyte to iron in the catholyte is at least 1.25, wherein the redox flow battery system, at a state of charge of 0%, has a molarity of $H^+$ in the anolyte that is at least 10% less than a molarity of $H^+$ in the catholyte;
a first electrode in contact with the anolyte;
a second electrode in contact with the catholyte; and
a separator separating the anolyte from the catholyte.

2. The redox flow battery system of claim 1, wherein the anolyte further comprises iron ions in the solution and the catholyte further comprises chromium ions in the solution.

3. The redox flow battery system of claim 2, wherein a molarity of the iron ions in the anolyte is within 25% of a molarity of iron ions in the catholyte and a molarity of the chromium ions in the anolyte is within 25% of a molarity of chromium ions in the catholyte.

4. The redox flow battery system of claim 1, wherein a volume of the anolyte is at least 1.25 times a volume of the catholyte.

5. The redox flow battery system of claim 4, wherein a molarity of the chromium ions in the anolyte is equal to a molarity of the iron ions in the catholyte.

6. The redox flow battery system of claim 1, wherein a volume of the anolyte is at least 1.43 times a volume of the catholyte.

7. The redox flow battery system of claim 1, wherein a volume of the anolyte is at least 1.67 times a volume of the catholyte.

8. The redox flow battery system of claim 1, wherein the molar ratio of chromium ions in the anolyte to iron ions in the catholyte is at least 1.43.

9. The redox flow battery system of claim 1, wherein the molar ratio of chromium ions in the anolyte to iron ions in the catholyte is at least 1.67.

10. The redox flow battery system of claim 1, wherein the anolyte comprises chromium chloride to provide the chromium ions.

11. The redox flow battery system of claim 1, wherein the catholyte comprises iron chloride to provide the iron ions.

12. The redox flow battery system of claim 1, wherein the anolyte and catholyte both further comprise hydrochloric acid.

13. The redox flow battery system of claim 1, wherein utilization of chromium in the anolyte is limited by the amount of iron in the catholyte.

14. The redox flow battery system of claim 13, wherein the utilization of chromium in the anolyte is limited to no more than 80% by the amount of iron in the catholyte.

15. The redox flow battery system of claim 1, wherein the redox flow battery system does not comprise a homogenous catalyst.

16. The redox flow battery system of claim 1, wherein the redox flow battery system does not comprise a metallic catalyst.

17. The redox flow battery system of claim 1, wherein the redox flow battery system, at a state of charge of 0%, has a molarity of $H^+$ in the anolyte that is at least 20% less than a molarity of $H^+$ in the catholyte.

18. The redox flow battery system of claim 1, wherein the redox flow battery system, at a state of charge of 0%, has a molarity of $H^+$ in the anolyte that is at least 25% less than a molarity of $H^+$ in the catholyte.

19. The redox flow battery system of claim 1, wherein the redox flow battery system, at a state of charge of 0%, has a molarity of $H^+$ in the anolyte that is at least 50% less than a molarity of $H^+$ in the catholyte.

20. The redox flow battery system of claim 1, wherein the redox flow battery system is configured so that, at a state of charge of 50%, a molarity of $H^+$ in the anolyte is equal to a molarity of $H^+$ in the catholyte.

* * * * *